(12) United States Patent
Shearman et al.

(10) Patent No.: US 8,154,867 B2
(45) Date of Patent: Apr. 10, 2012

(54) HIGH DENSITY SWITCHING PLATFORM WITH INTERBAY CONNECTIONS ARRANGEMENT

(75) Inventors: Simon John Edward Shearman, Almonte (CA); Anthony John Mayenburg, Carp (CA); Thomas Charles Currie, Ottawa (CA)

(73) Assignee: Ciena Corporation, Linthicum, MD (US)

( * ) Notice: Subject to any disclaimer, the term of this patent is extended or adjusted under 35 U.S.C. 154(b) by 103 days.

(21) Appl. No.: 12/753,381

(22) Filed: Apr. 2, 2010

(65) Prior Publication Data

US 2011/0222241 A1    Sep. 15, 2011

Related U.S. Application Data

(60) Provisional application No. 61/312,499, filed on Mar. 10, 2010.

(51) Int. Cl.
*G06F 1/20* (2006.01)
*H05K 7/20* (2006.01)

(52) U.S. Cl. .............. 361/679.5; 361/679.48; 361/690; 361/694; 361/695; 361/727; 312/236; 454/184

(58) Field of Classification Search .. 361/679.48–679.5, 361/690, 694–695, 721, 724, 727; 312/223.2, 312/236; 454/184
See application file for complete search history.

(56) References Cited

U.S. PATENT DOCUMENTS

| | | | |
|---|---|---|---|
| 6,698,079 B1 | 3/2004 | Mimlitch, III et al. | |
| 7,184,267 B2 | 2/2007 | Patel | |
| 7,515,416 B2 | 4/2009 | McBain et al. | |
| 7,633,754 B1 | 12/2009 | Mumper | |
| 7,701,710 B2 * | 4/2010 | Tanaka et al. | 361/679.5 |
| 7,864,519 B2 * | 1/2011 | Lin et al. | 361/679.33 |
| 7,933,120 B2 * | 4/2011 | Tanaka et al. | 361/679.5 |
| 2007/0258211 A1 | 11/2007 | Sonobe et al. | |
| 2008/0192454 A1 * | 8/2008 | Knutsson | 361/796 |

FOREIGN PATENT DOCUMENTS

WO    WO 2010022597 A1 *    3/2010

* cited by examiner

*Primary Examiner* — Robert J Hoffberg
(74) *Attorney, Agent, or Firm* — Christopher & Weisberg, P.A.

(57) ABSTRACT

A high density switching platform arranges multiple circuit cards interconnected by a single backplane. A single backplane has three sets of circuit cards on one side. A shared ventilation chamber on the other side of the backplane draws ambient air through each of the three sets of circuit cards independently. The air flow also allows cooling of power modules that supply power to the circuit cards. The platform allows interconnection of its circuit cards with circuit cards in adjacent platforms.

14 Claims, 11 Drawing Sheets

HIGH DENSITY SWITCHING PLATFORM WITH INTERBAY CONNECTIONS ARRANGEMENT

CROSS-REFERENCE TO RELATED APPLICATION

This application is related to and claims priority to U.S. Provisional Patent Application Ser. No. 61/312,499, filed Mar. 10, 2010, titled HIGH DENSITY SWITCHING PLATFORM WITH INTERBAY CONNECTIONS ARRANGEMENT, the entirety of which is incorporated herein by reference.

STATEMENT REGARDING FEDERALLY SPONSORED RESEARCH OR DEVELOPMENT n/a

FIELD OF THE INVENTION

The present invention relates generally to an electronics equipment rack and more specifically to a method and system for an expandable electronic telecommunication switch rack that uses a single backplane.

BACKGROUND OF THE INVENTION

Telecommunication switches located within service provider facilities are used to switch communication data packets from one communication link, e.g., fiber optic cable, to another. Such a series of switches allows the data comprising the phone call or data session to be switched through the communication network to a destination. Due to physical limitations within the service provider facilities, the switch sizes, i.e., footprint, is limited. A switch typically includes a number of interface cards electrically interconnected with switch cards, also referred to as a "switch fabric card." The electrical or fiber optic cables are terminated and driven by the interface cards, while the switch fabric cards switch the data packets from one interface card to another.

To provide interconnection and also allow the removal and replacement of interface and switch fabric cards, interface and switch fabric cards are often connected through a "backplane." This arrangement allows the interconnection of the many cards over short distances on a high density platform. The faceplates of interface cards typically allow external connections and should permit connection or termination of multiple cables as well as a way to dress those cables without effecting maintenance to adjacent working cards. Similarly, the faceplates of switch fabric cards should allow termination of multiple cables that interconnect with adjacent systems and allow opportunity for switch fabric expandability.

Due to the high frequencies involved, the signal path distance between interface and switch fabric cards should be as short as possible to minimize degradation of the signal. To minimize signal degradation, several interface and switch fabric cards are interconnected in close proximity on the backplane. Because of the substantial cost of a backplane and small footprint availability at the service provider facilities, electronics racks are designed to connect as many circuit cards as possible through a single backplane. Interface and switch fabric cards on a back plane are typically arranged in sets of parallel, closely spaced rows of cards, with only small spaces between them.

Interface and switch fabric cards, referred to collectively herein as "circuit cards," are substantially planar and populated with electronic circuitry and components. Circuit cards typically consume considerable power and therefore generate a substantial amount of waste heat during operation. For example, it is not uncommon for circuit cards to consume 700 Watts of power each. To prevent damage to the sensitive electronic circuitry in the circuit cards, this waste heat must be removed. To remove this waste heat, ambient air is typically blown through the spaces, or slots, between circuit cards. As the cards become more closely arranged, minimizing the distance between connections and maximizing the number of circuit cards in a given footprint, it becomes increasing difficult to adequately cool sets of cards arranged across a single backplane.

Several different card arrangements have been developed to minimize the distance between cards and maximize economy of space while providing adequate cooling of the circuitry. In one arrangement, interface cards are arranged on two separate backplanes. The two backplanes are then interconnected by switch fabric cards connected to both backplanes. However, this design requires very precise alignment of the switch fabric cards and backplanes within a rack, or housing. This is difficult to achieve and even a small misalignment can result in damage to the electrical interface pins connecting the switch fabric cards to the backplanes. In addition, the use of an additional backplane substantially increases the cost of this configuration.

Another possible arrangement disposes the interface cards on one side of the backplane while placing the switch fabric cards on an opposite side of the backplane. This arrangement minimizes the distance between the card connections, but suffers from poor economy of space and requires access to both sides of the rack. The additional space required to accommodate cards extending out from both sides of the backplane makes this design impractical for interconnecting several platforms.

Both of the above described arrangements also pose substantial challenges to adequate cooling of the closely spaced cards. Often, the ambient air used to cool the circuit cards is passed sequentially over two or more sets of cards. The first set of cards often transfers so much heat to the cooling air that subsequent sets of cards are not sufficiently cooled.

The methods of supplying ambient air to sets of circuit cards also present challenges. Cooling fans often create turbulent airflow on the downstream side of the fan. In a platform that has a high circuit card density, the turbulent airflow often results in unequal flow rates through the slots formed between the cards. In order to assure adequate airflow through each slot, larger or more fans are sometimes used in the device even though the total airflow is theoretically sufficient to cool each component of the device. One alternative is to use ducting to direct airflow to each slot. Another is to use baffles to limit airflow in slots that would otherwise receive more airflow than necessary in order to force the flow to other slots.

Each of these techniques has disadvantages. Larger or extra fans take up additional space, are more expensive and consume excess power. Baffles increase cost and the overall pressure in the system, and may require use of larger or more fans than otherwise theoretically necessary. Thus, current techniques for directing airflow often result in electronic device designs resulting in an inefficient use of power, space and/or production resources.

Therefore, what is needed is a system and method that provides efficient cooling capability in a telecommunications equipment rack that supports a high density circuit card arrangement.

SUMMARY OF THE INVENTION

The present invention provides a method and system for a high density electronics platform. In accordance with one aspect the present invention provides a housing having a first side and a second side opposite the first side. A backplane has a first side and a second side opposite the first side in which the backplane is positioned within the housing such that the first side of the backplane faces the first side of the housing. A first set of circuit cards is removably connected to the first side of the backplane and is arranged in a first direction. A second set of circuit cards is removably connected to the first side of the backplane and is arranged in the first direction. A central set of circuit cards is removably connected to the first side of the backplane between the first set of circuit cards and the second set of circuit cards, and is arranged orthogonally to the first direction. A shared ventilation chamber is adjacent to the second side of the backplane.

In accordance with another aspect, the present invention provides an apparatus in which a housing has a first side, a second side opposite the first side and a third side adjacent to the second side and the first side. A backplane is positioned within the housing and has a first side facing the first side of the housing, a second side facing the second side of the housing and a ventilation notch. A first set of interface cards is arranged in a first direction and is removably positioned between the first side of the backplane and the first side of the housing. A first ventilation chamber is adjacent to and in fluid communication with the first set of interface cards. A second set of interface cards is arranged in the first direction and is removably positioned between the first side of the backplane and the first side of the housing. A second ventilation chamber is adjacent to and in fluid communication with the second set of interface cards. A central set of switch fabric cards is arranged orthogonal to the first direction and is removably positioned between the first set of interface cards and the second set of interface cards. A central ventilation chamber is adjacent to and is in fluid communication with the central set of circuit cards, and is positioned between the first set of interface cards and the second set of interface cards. A shared ventilation chamber is positioned between the second side of the backplane and the second side of the housing. The ventilation notch of the backplane provides fluid communication between the shared ventilation chamber and the central ventilation chamber.

In accordance with yet another aspect, the present invention provides a method for cooling an electronic apparatus in which the electronic apparatus includes a backplane having a first side and a second side opposite the first side positioned within a housing. A first set of circuit cards removably connected to the first side of the backplane and arranged in a first direction is provided. A second set of circuit cards removably connected to the first side of the backplane and arranged in the first direction is provided. A central set of circuit cards removably connected to the first side of the backplane between the first set of circuit cards and the second set of circuit cards and arranged orthogonally to the first direction is provided. Ambient air is drawn through the first set of circuit cards from outside the housing. Ambient air is drawn through the second set of circuit cards from outside the housing. Ambient air is drawn through the central set of circuit cards from outside the housing. The ambient air is simultaneously drawn through the first set of circuit cards, the second set of circuit cards and the central set of circuit cards.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION OF THE INVENTION

Figure 1:
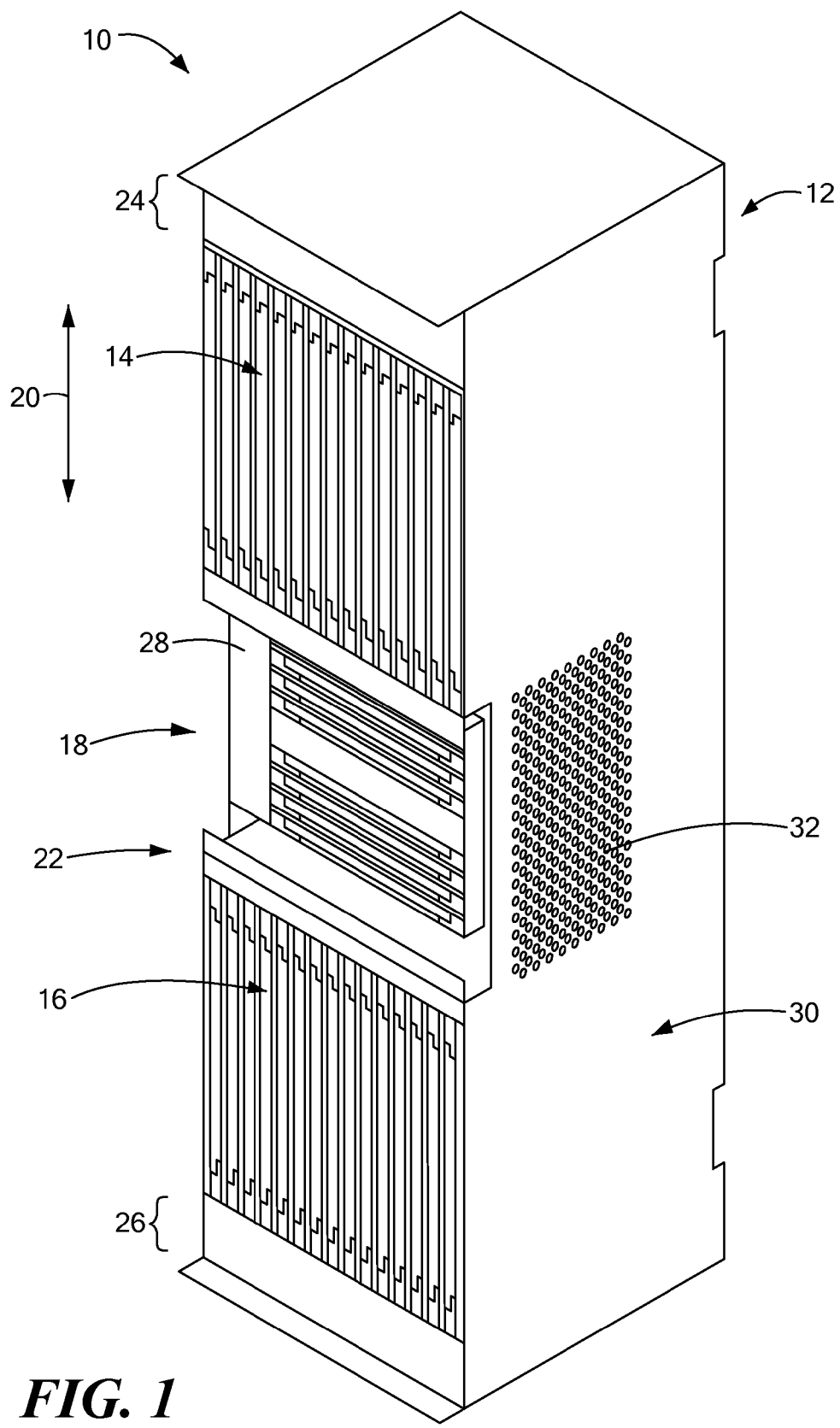
FIG. 1 is a perspective view of a high density platform constructed in accordance with the principles of the present invention.

Before describing in detail exemplary embodiments that are in accordance with the present invention, it is noted that the embodiments reside primarily in combinations of apparatus components and processing steps related to implementing a system and method for a high density switching platform with interbay connections arrangements. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

One embodiment of the present invention provides a method and telecommunication switching system having a cooling capability, circuit card density and a cable management solution not previously known. The platform includes a single backplane having a circuit card arrangement and airflow notch that allows a large number of high density faceplate connections to interconnect with adjacent bays, or platforms while still allowing ambient air to cool switch fabric and interface circuit cards. The arrangement of the platform also allows removal of circuit cards without having to disturb adjacent circuit cards cables or fibers. Of note, although the terms "cables" and "fibers" are both used herein, it is understood that the present invention uses these terms interchangeably.

Referring now to the drawing figures in which like reference designators refer to like elements, there is shown in FIG. 1 an exemplary high density platform 10 constructed in accordance with the principles of the present invention. High density platform 10 includes a housing 12. As used herein, "housing" refers to any electronics rack, cabinet, case or other apparatus used to arrange and/or support a plurality of electronic components such as circuit cards, including interface cards and switch fabric cards. The housing 12 may be metal, plastic, or combination, or other suitable material and similar in construction to other housings, cabinets and/or racks used to hold electronic components in place.

The housing 12 has a first, e.g., front, side 22, a second, e.g., rear, side 34 opposite the first side 22 and a third side 30 adjacent to both the first side 22 and the second side 34. The housing 12 supports a first set of interface cards 14, a second set of interface cards 16 and a central set of switch fabric cards 18. The first set of interface cards 14 are arranged in a first direction 20. The second set of interface cards 16 are also arranged in the first direction 20. The central set of switch fabric cards is arranged orthogonally, i.e., perpendicular, to the first direction 20. Each of the first set of interface cards 14, the second set of interface cards 16 and the central set of switch fabric cards 18 may optionally be surrounded by a separate metallic Faraday Cage including, for example a metal mesh screen. The orthogonal arrangement of the switch fabric cards 18 as compared with the interface cards 16, when combined with a system 10, allows faceplate interconnections from the first system to the next without preventing removability of the switch fabric cards or interface cards, due to cable dressing interference.

Each of the first set of interface cards 14, the second set of interface cards 16 and the central set of switch fabric cards 18 may also optionally be held in place by a frame or other support structure that may hold the sets of circuit cards 14, 16 and 18 firmly in place and facilitate removal and replacement of the circuit cards 14, such as for example a card cage or similar structure. The first set of interface cards 14, the second set of interface cards 16 and the central set of switch fabric cards 18 may all be removably inserted into the housing 12 through a first, e.g., front, side 22 of the housing 12, thereby allowing circuit cards 14, 16 and 18 to be inserted and removed from the first side.

The housing 12 includes a first ventilation chamber 24 adjacent to the first set of interface cards 14, a second ventilation chamber 26 adjacent to the second set of interface cards 16 and a central ventilation chamber 28 adjacent to the central set of switch fabric cards 18. Each of the first ventilation chamber 24, the second ventilation chamber 26 and the central ventilation chamber 28 may be substantially sealed except at the airflow entry and exit points in order to facilitate directional airflow in each of the chambers.

The third side 30 of the housing 12 has a side air access 32 located opposite to the central ventilation chamber 28 that is aligned with the central set of switch fabric cards 18. In this embodiment, the side air access 32 has openings there through forming a honeycomb pattern on the third side 30. Optionally, the side air access 32 may have a single, large opening, a series of elongate slits or other openings to facilitate the passing of ambient air through the side air access 32. The side air access 32 facilitates the flow of ambient air across the first set of interface cards 14, the second set of interface cards 16 and the central set of switch fabric cards 18.

Figure 2:
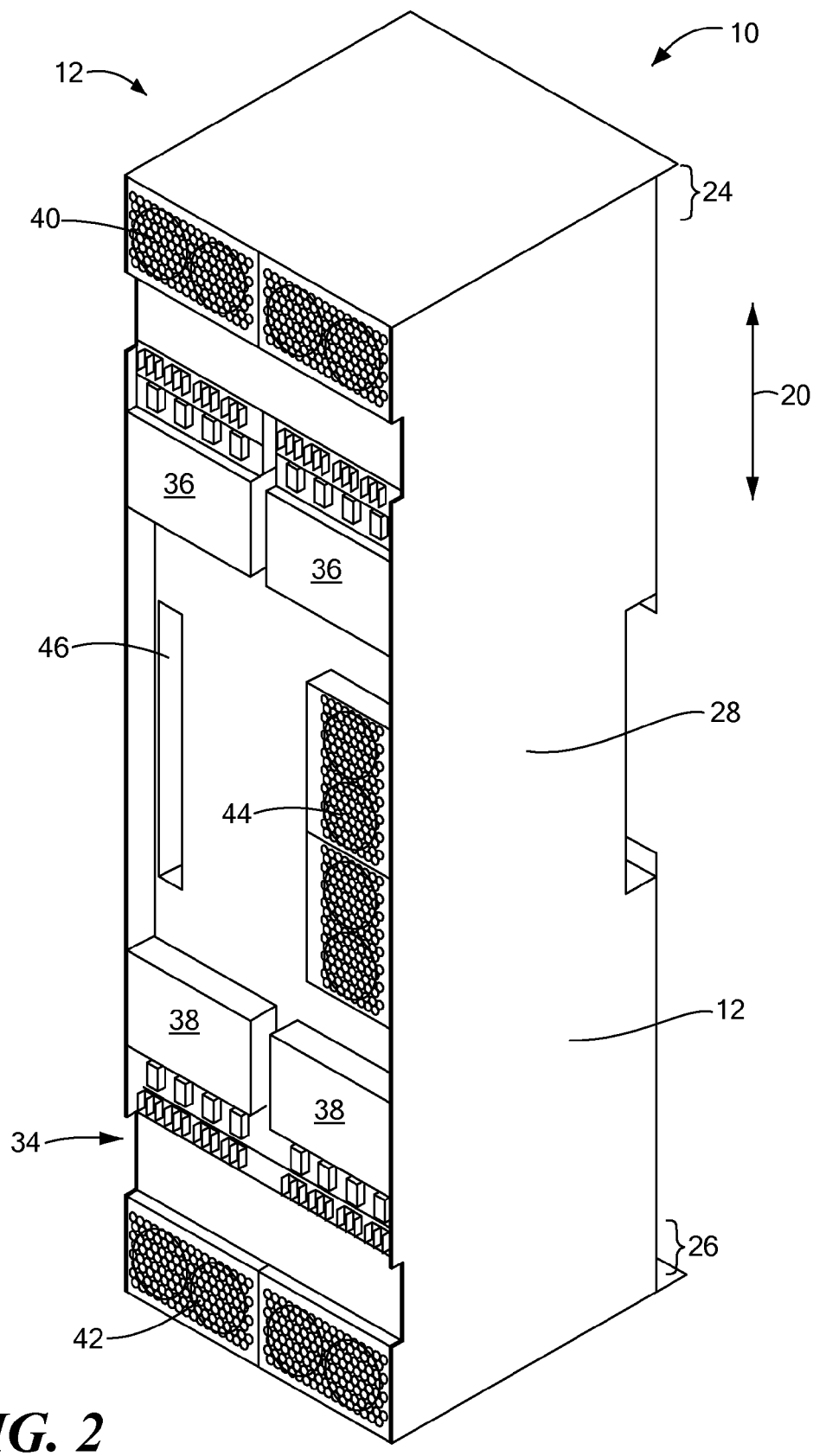
FIG. 2 is another perspective view of the high density platform of FIG. 1.

FIG. 2 is perspective view that shows the second, i.e., rear, side 34 of the platform shown in FIG. 1. The second side 34 is opposite the first side 22. First power modules 36 and second power modules 38 are positioned proximate to the second side 34 of the housing 12. By positioning the first power modules 36 and the second power modules 38 proximate to the second side 34 of the housing 12, room is available for inter-platform connections and additional features on the first side 22 of the housing 12. In this embodiment, there are two first power modules 36 and two second power modules 38. Optionally, there may be more or fewer first power modules 36 and/or more or fewer second power modules 38, depending on the redundancy and power requirements of a particular system 10.

A first cooling unit 40 may be adjacent to and in fluid communication with the first ventilation chamber 24. In this embodiment, the first cooling unit 40 has four fans. Optionally, the first cooling unit may include other devices for removing air from the first ventilation chamber 24, such as for example an air pump or a duct in communication with a vacuum system. The first cooling unit 40 may optionally include fewer, larger fans or additional smaller fans. A second cooling unit 42 is adjacent to and in fluid communication with the second ventilation chamber 26. A central cooling unit 44 is in fluid communication with the central ventilation chamber 28 and may create airflow within the central ventilation chamber 28. The second cooling unit 42 and the central cooling unit 44, like the first cooling unit 40, have four fans, but may optionally be comprised of other devices for removing air.

The first cooling unit 40 and the second cooling unit 42 may be arranged transverse across the housing 12. The central cooling unit 44 may be arranged longitudinally within the housing 12. This arrangement may facilitate even air flow through the first set of interface cards 14, the second set of interface cards 16 and the central set of switch fabric cards 18. The second side 34 may optionally include an access cavity 46 that allows access to the interior of the housing 12 from the second side 34.

Figure 3:
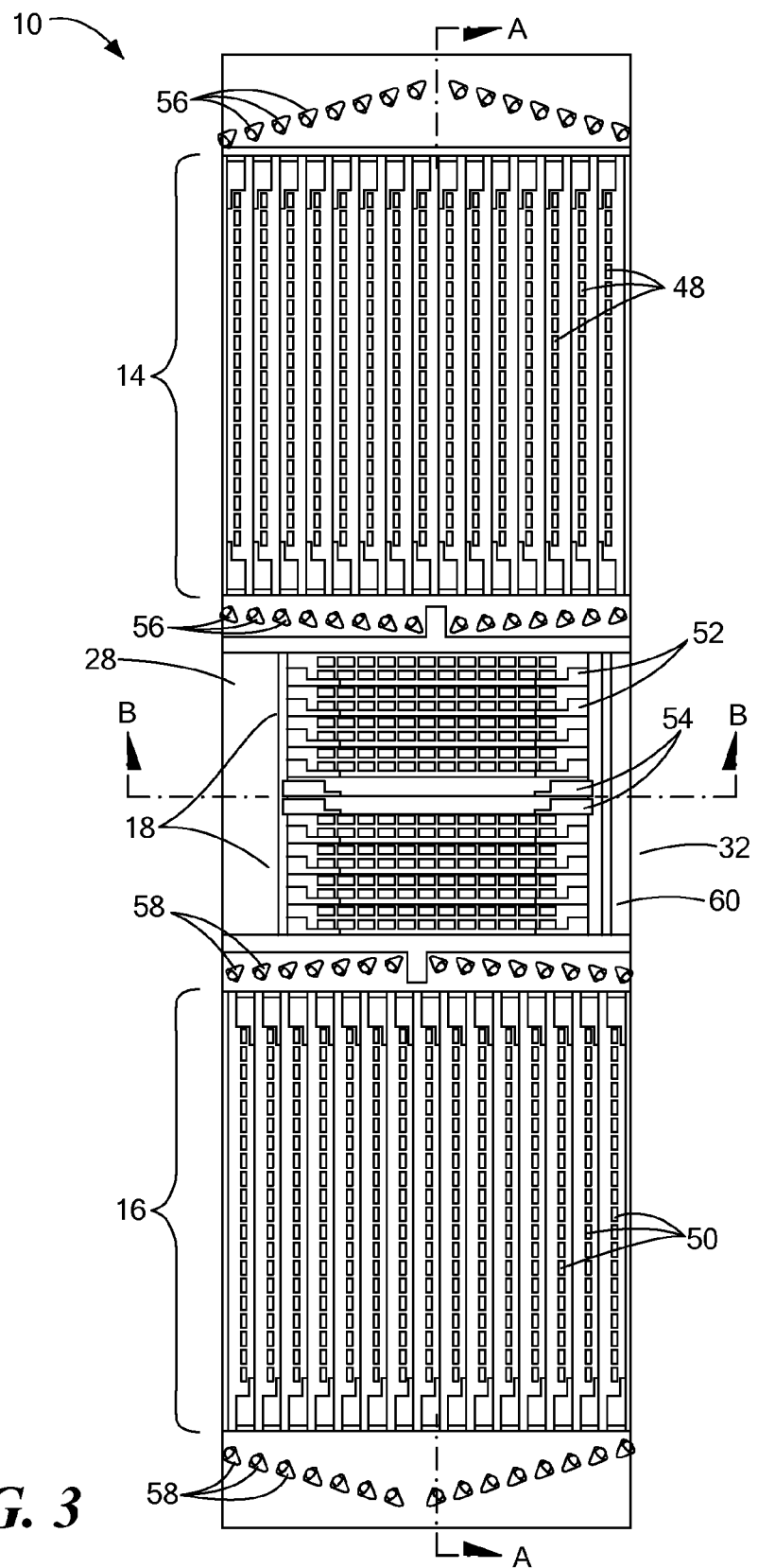
FIG. 3 is a front view of the high density platform of FIG. 1.

FIG. 3 is a front view showing features on the first side 22 of the housing 12. In this embodiment, the first set of interface cards 14 may include fifteen interface cards 48. Similarly, the second set of interface cards 16 may include fifteen interface cards 50. Although the interface cards 48 and the interface cards 50 may all be aligned in the first direction 20, the interface cards 50 are oriented such that they are inverted compared to the orientation of interface cards 48. Electrical backplane connectors on the interface cards 48 and 50 are located substantially at a corner edge of the card. This allows the same cards to be used for interface cards 48 and 50 while also allowing the size of the backplane to be minimized. The first set of interface cards 14 and the second set of interface cards 16 include interface cards may be electrically or optically interconnected to interface cards in neighboring electronics racks and/or housings. The first set of interface cards 14 and the second set of interface cards 16 may optionally include other types of circuit cards. Optionally more or fewer circuit cards may be included in each of the first set of interface cards 14 and the second set of interface cards 16.

The central set of switch fabric cards 18 has eight switch fabric cards 52 and two shelf processor cards 54 in this embodiment. The switch fabric cards 52 interconnect to each of the sets of interface cards 48 and 50 through a single backplane to facilitate signal transmissions among and between the interface cards 48 and the interface cards 50. The shelf processor cards 54 coordinate system timing, operation and remote control. Optionally, the central set of switch fabric cards 18 may include more or fewer switch fabric cards and more or fewer shelf processor cards. Optionally, the central set of switch fabric cards 18 may include one or more other types of circuit cards.

Each of interface card sets 14 and 16 uses fiber radius bend limiters to keep fiber optic cables dressed within its set of origination. These bend limiters maintain a minimum bend radius on the fiber optic cables as the cables are re-directed ninety degrees to exit the platform. The first fiber optic bend radius limiters 56 are arranged diagonally upward toward the center of the housing 12. The fiber optic bend radius limiters protect the fiber optic cable leaving circuit cards 48 vertically and direct the fibers optic cable out of the platform 10 horizontally. Similarly, second fiber optic bend radius limiters 58 are arranged diagonally downward toward the center of the housing 12.

A central air inlet 60 is positioned between the side air access region 32 and the central set of switch fabric cards 18. Like the side air access 32, the central air inlet 60 is opposite the central ventilation chamber 28.

Figure 4:
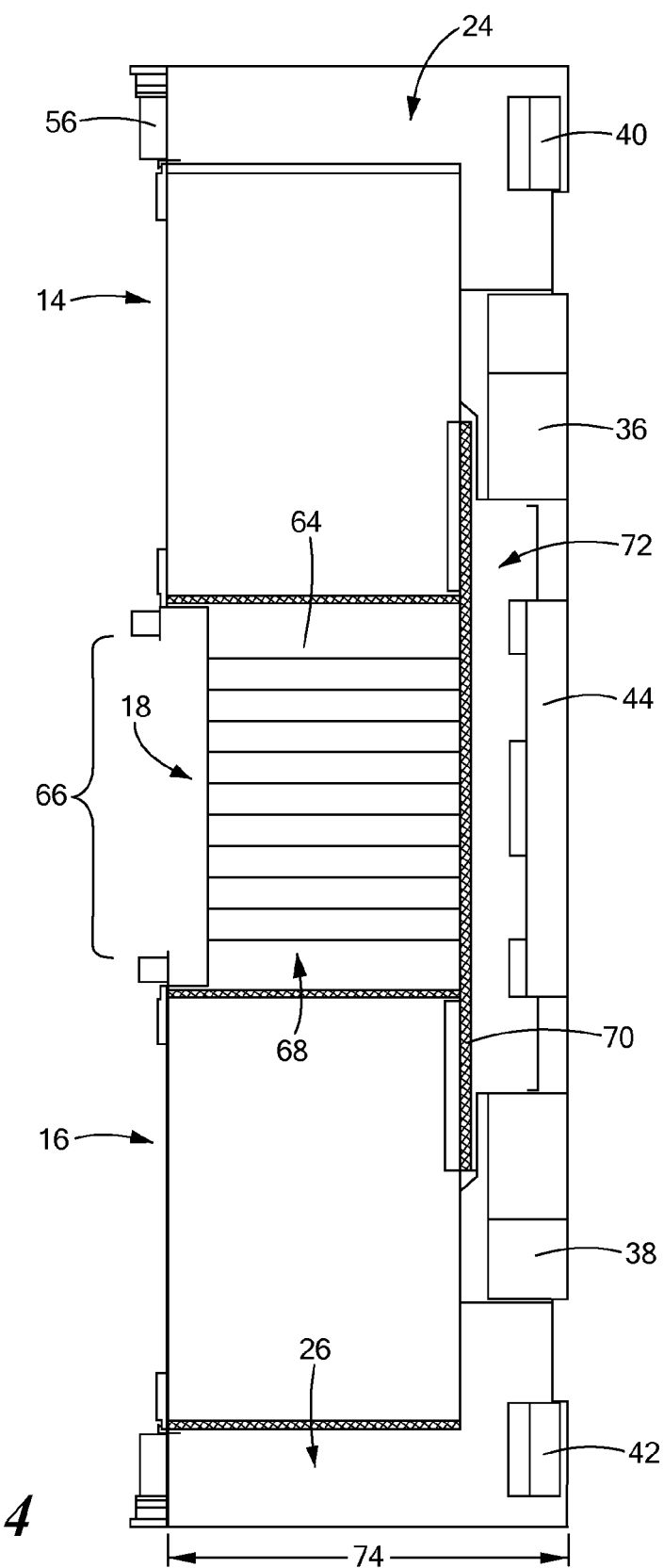
FIG. 4 is a cross-sectional view of the high density platform of FIG. 3 taken through section A-A.

FIG. 4 shows a cross-section of the platform 10 taken through section A-A in FIG. 3. The central set of switch fabric cards 18 in this embodiment are arranged to not extend as far from the backplane 70 as the first set of interface cards 14 and the second set of interface cards 16. This forms a recess 66 in the first side 22 of the housing 12 which facilitates fluid communication between ambient air adjacent to the first side 22 of the housing 12 and the first air inlet 64, the second air inlet 68 and the central air inlet 60. Additionally, both the first air inlet 64 and the second air inlet 68 may also be in fluid communication with the central air inlet 60 shown in FIG. 3 and may receive air through the side air access 32.

A shared ventilation chamber 72 is positioned between the backplane 70 and the second side 34 of the housing 12 and extends from the first power modules 36 located within the shared ventilation chamber 72 to the second power modules 38 also located within the shared ventilation chamber 72. The first power modules 36 are positioned within the shared ventilation chamber 72 and between the central cooling unit 44 and the first ventilation chamber 24. Similarly, the second power modules 38 are positioned within the shared ventilation chamber 72 and between the central cooling unit 44 and the second ventilation chamber 26.

The shared ventilation chamber 72 is in fluid communication with the first ventilation chamber 24 and the second ventilation chamber 26. The backplane 70 separates the shared ventilation chamber 72 from the first set of interface cards 14, the second set of interface cards 16 and the central set of switch fabric cards 18. The backplane 70 is connected to and provides removable interconnection between the first set of interface cards 14, the second set of interface cards 16 and the central set of switch fabric cards 18. Air passing from the first ventilation chamber 24 to the shared ventilation chamber 72 passes over the first power modules 36, thereby cooling them. Similarly, air passing from the second ventilation chamber 26 to the shared ventilation chamber 72 passes over power modules 38, thereby cooling them. Shared ventilation chamber 72 is also in fluid communication with the central ventilation chamber 28. Cooling units 44 are in fluid communication with and remove air from the shared ventilation chamber 70, creating airflow there through. The housing 12 has a depth 74. In this embodiment, the depth 74 is about 60 centimeters, but may optionally be more or less.

Figure 5:
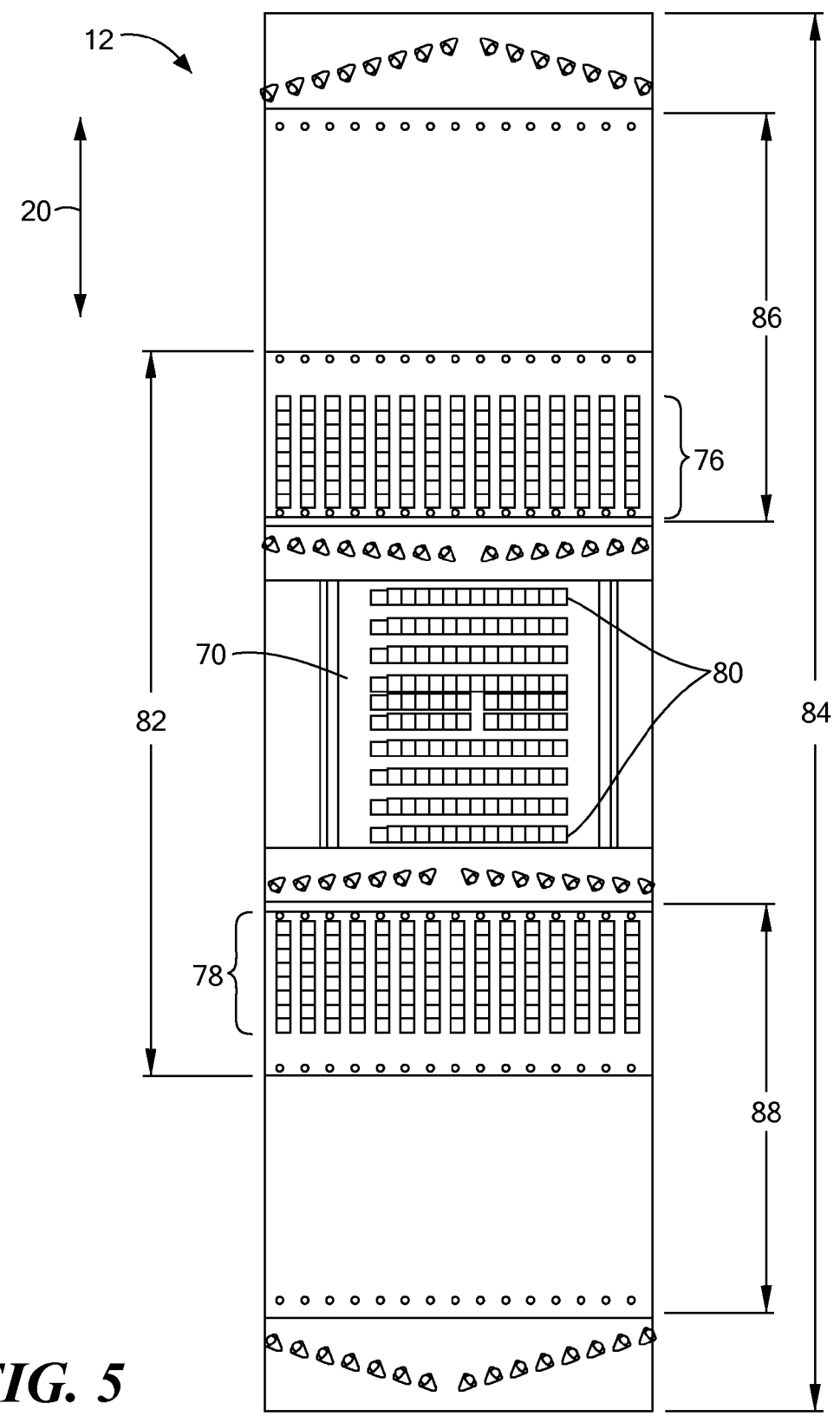
FIG. 5 is a front view of the high density platform of FIG. 1 with the interface and switch fabric cards removed.

FIG. 5 is a front view of the housing 12 with the first set of interface cards 14, the second set of interface cards 16 and the third set of cards 18 removed. The backplane 70 may have a first series of connectors 76 arranged in the first direction 20 for attachment of the first set of interface cards 14, a second series of connectors 78 arranged in the first direction 20 for attachment of the second set of interface cards 16 and a central series of connectors 80 arranged perpendicular to the first direction 20 for the central set of switch fabric cards 18. In this embodiment, the maximum distance 82 from a first processor on an interface card 48 or 50, to its corresponding backplane connector, across the backplane 70, to the fabric card backplane connectors, and then to a second processor on the fabric card about forty inches (about 102 centimeters), but may optionally be more or less. Also in this embodiment, the length 84 of the housing 12 is about eighty four inches (about 213 centimeters), but may optionally be more or less. The distance 86 between the first air inlet 64 and the first ventilation chamber 24 is about twenty four inches (about 61 centimeters), but may optionally be more or less. Similarly, the length 88 between the second air inlet 68 and the second ventilation chamber 26 is about 24 inches (about 61 centimeters), but may optionally be more or less. The cards 48 in the first set of interface cards 14 may extend in the first direction 20 a distance equal to or less than the distance 86, while the cards 50 of the second set of interface cards 16 may extend a distance equal to or less than the distance 88.

Figure 6:
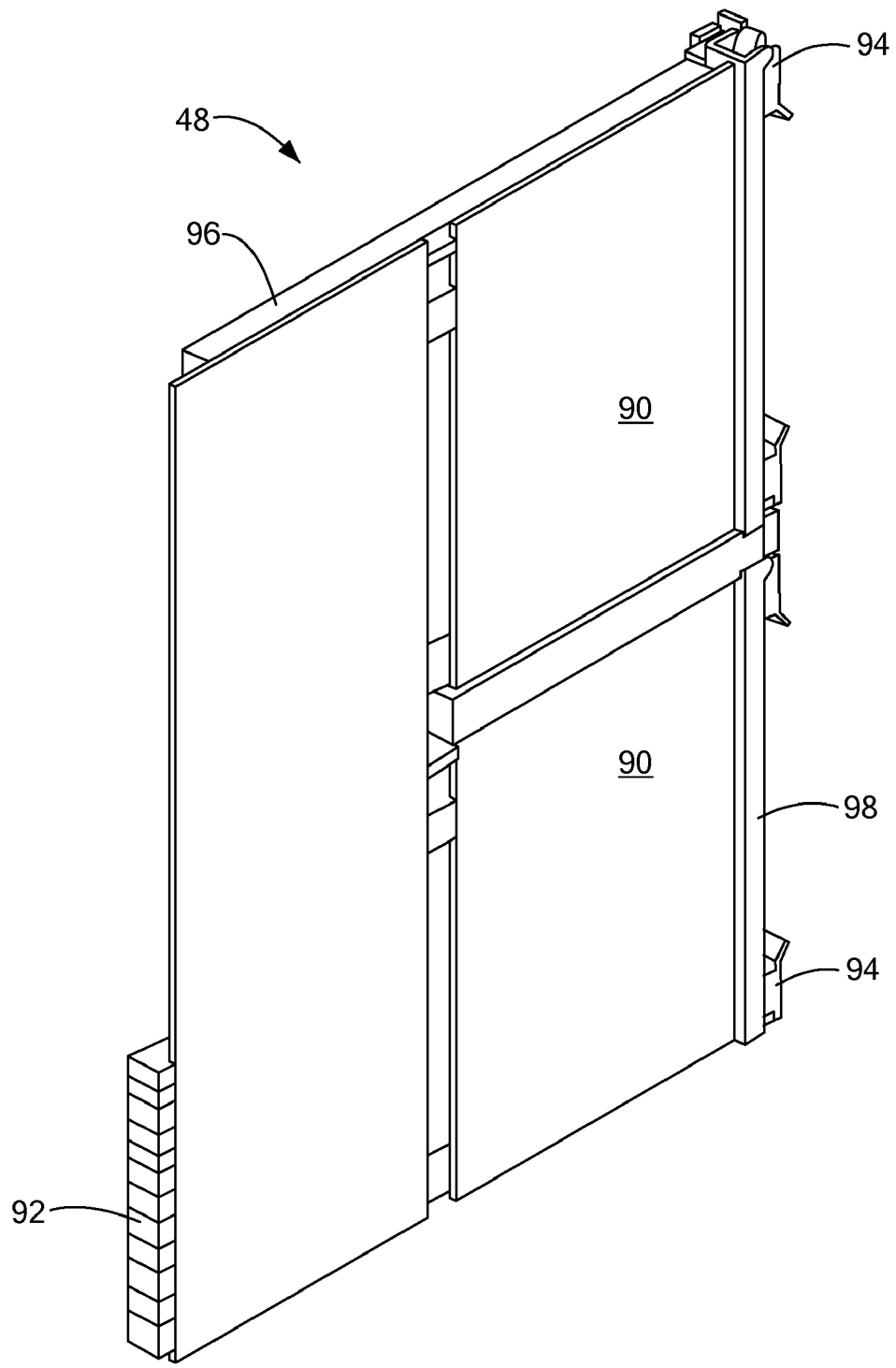
FIG. 6 is a perspective view of an exemplary interface card of FIG. 1.

FIG. 6 shows an exemplary interface card 48 of the first set of interface cards 14. The interface card 48 includes electrical circuit packs 90 and a connector 92 for attachment to the backplane. Optionally, the interface card 48 may include latches 94 for secure attachment of the cards to the housing 12. The body 96 may be generally thinner than the face 98 and/or the connector 92 such that when the faces of a set of interface cards 48 are arranged side by side, a small space, or slot, remains between the bodies of the interface cards 48, allowing air to pass between adjacent interface cards 48. Other circuit cards, including switch fabric cards 52 and shelf processor cards 54 similarly may have a face that is thicker than the body in order to facilitate passage of air between adjacent cards and to allow indicators, such as light emitting diodes, to be positioned within the face.

Figure 7:
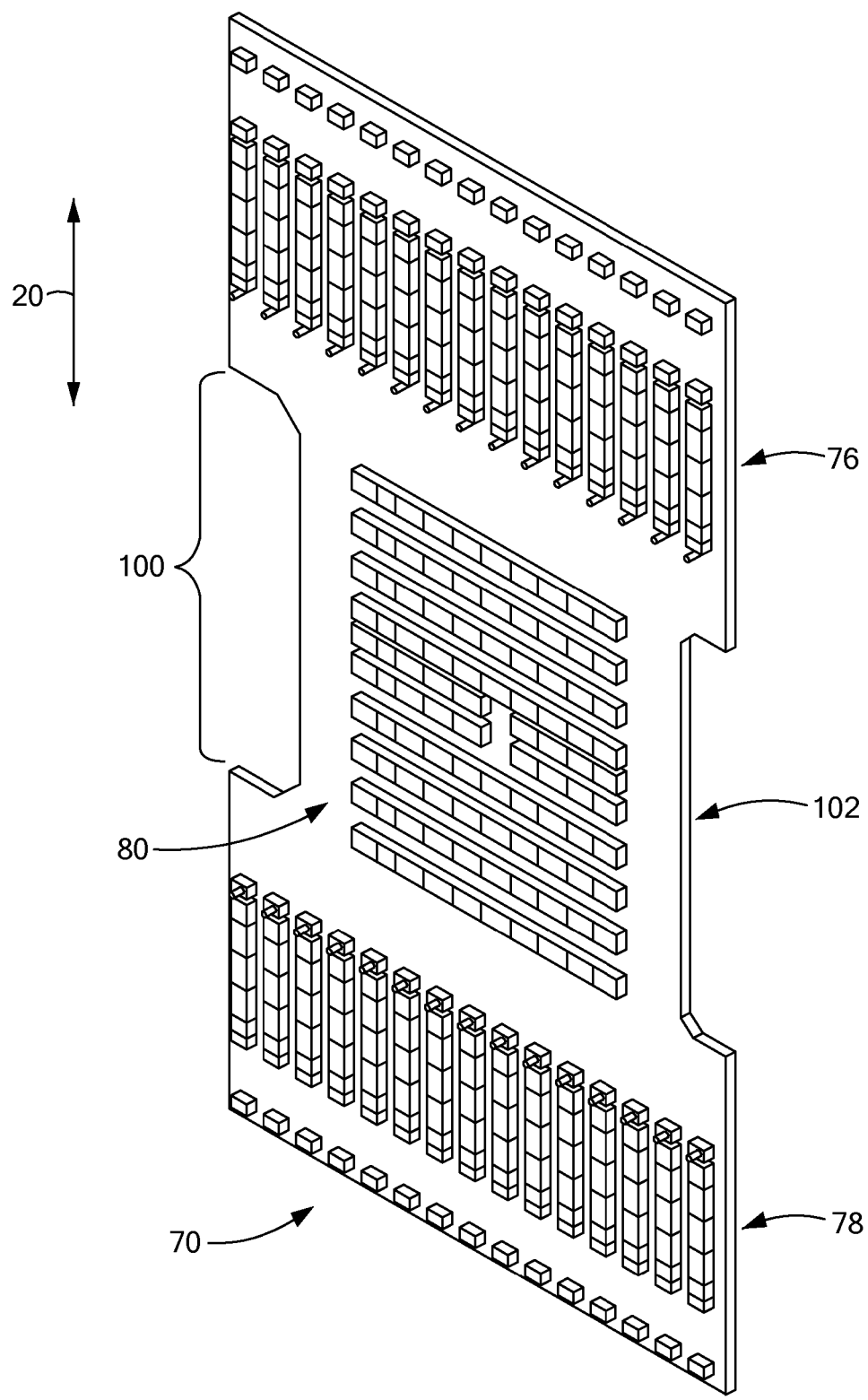
FIG. 7 is a perspective view of the backplane of FIG. 5.

FIG. 7 shows the backplane 70 having the first series of connectors 76 and the second series of connectors 78 aligned in the first direction 20. The central series of connectors 80 is aligned perpendicular to the first direction 20. The backplane 70 may include a ventilation notch 100. Notch 100 facilitates fluid communication between the central ventilation chamber 28 and the shared ventilation chamber 72 shown in FIG. 4. The backplane 70 also may optionally include an access notch 102. The access notch 102 is adjacent to access cavity 46 shown in FIG. 2 and may allow access from the second side 34 of the housing 12 to the shared ventilation chamber 72 and/or other features inside the housing 12, e.g., an air filter.

Figure 8:
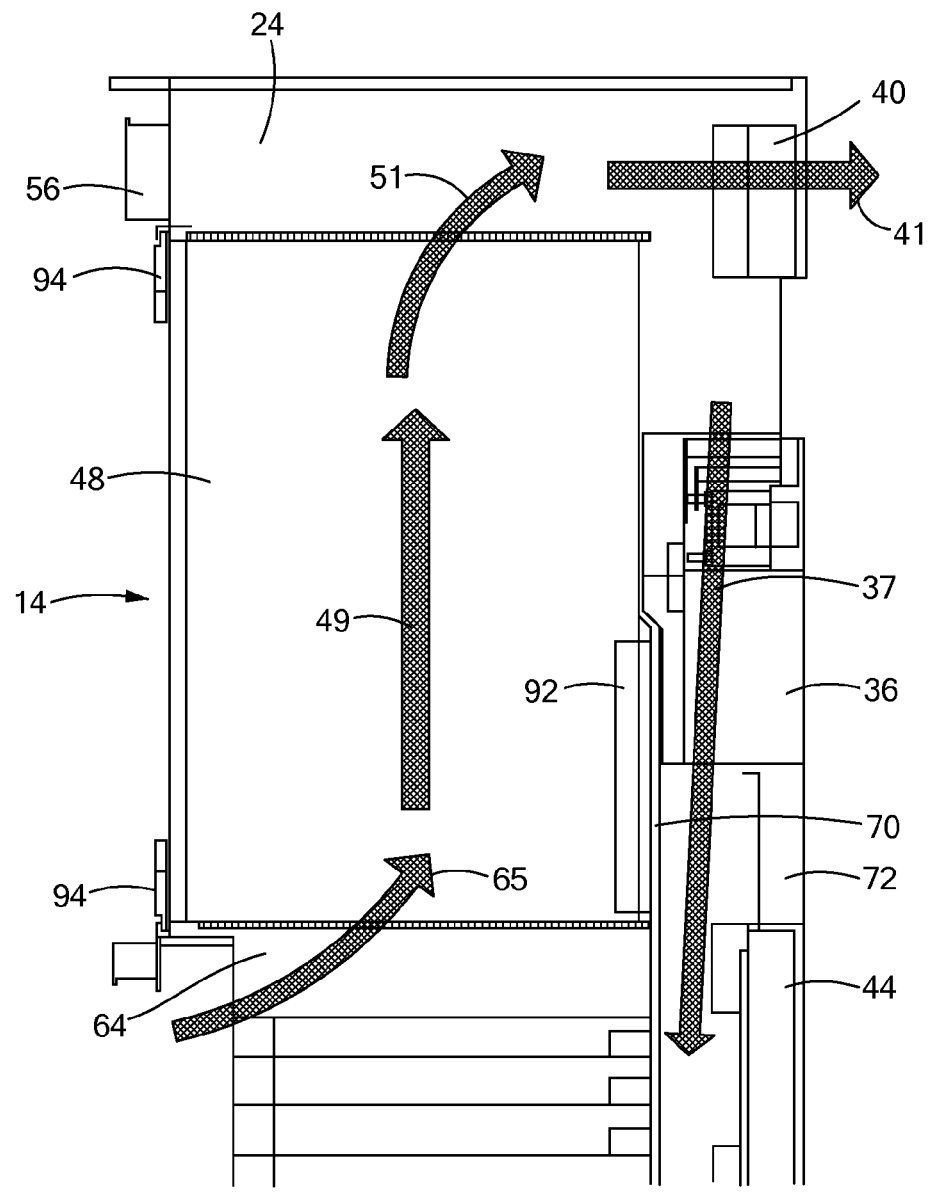
FIG. 8 is an enlarged cross-sectional view of the high density platform of FIG. 4.

FIG. 8 shows an enlarged cross-section of the platform 10 at section A-A in FIG. 3. An interface card 48 of the first set of interface cards 14 may be secured in place with latches 94. The cards 48 are attached to the backplane 70 by the connectors 92. Ambient air flows from the recess 66 in the first side 22 of the housing 12 and into the first air inlet 64. The first cooling units 40 may create a pressure differential within the first ventilation chamber 24 by pulling air out of the ventilation chamber 24 as indicated by directional arrow 41. This causes ambient air to flow from the first air inlet 64 to the first ventilation chamber 24 as shown by directional arrow 65. Air then travels across and between the interface cards 48 as shown by directional arrow 49. As the air flows between the interface cards 48, waste heat from the circuits of the interface cards 48 is transferred to the air. A substantial portion of the now heated air from the first ventilation chamber 24 exits through the first cooling units 40 as shown by directional arrows 51 and 41.

The central cooling unit 44 creates a pressure differential within the shared ventilation chamber 72. This causes some of the air from the first ventilation chamber 24 to travel across the first power modules 36 and into the shared ventilation chamber 72, as illustrated by directional arrow 37. From the shared ventilation chamber 72, air exits out through the central cooling units 44, thus maintaining airflow in the shared ventilation chamber 72. This same process occurs through the second set of interface cards 16 and the second ventilation chamber 26 and cools the second power modules 38.

Figure 9:
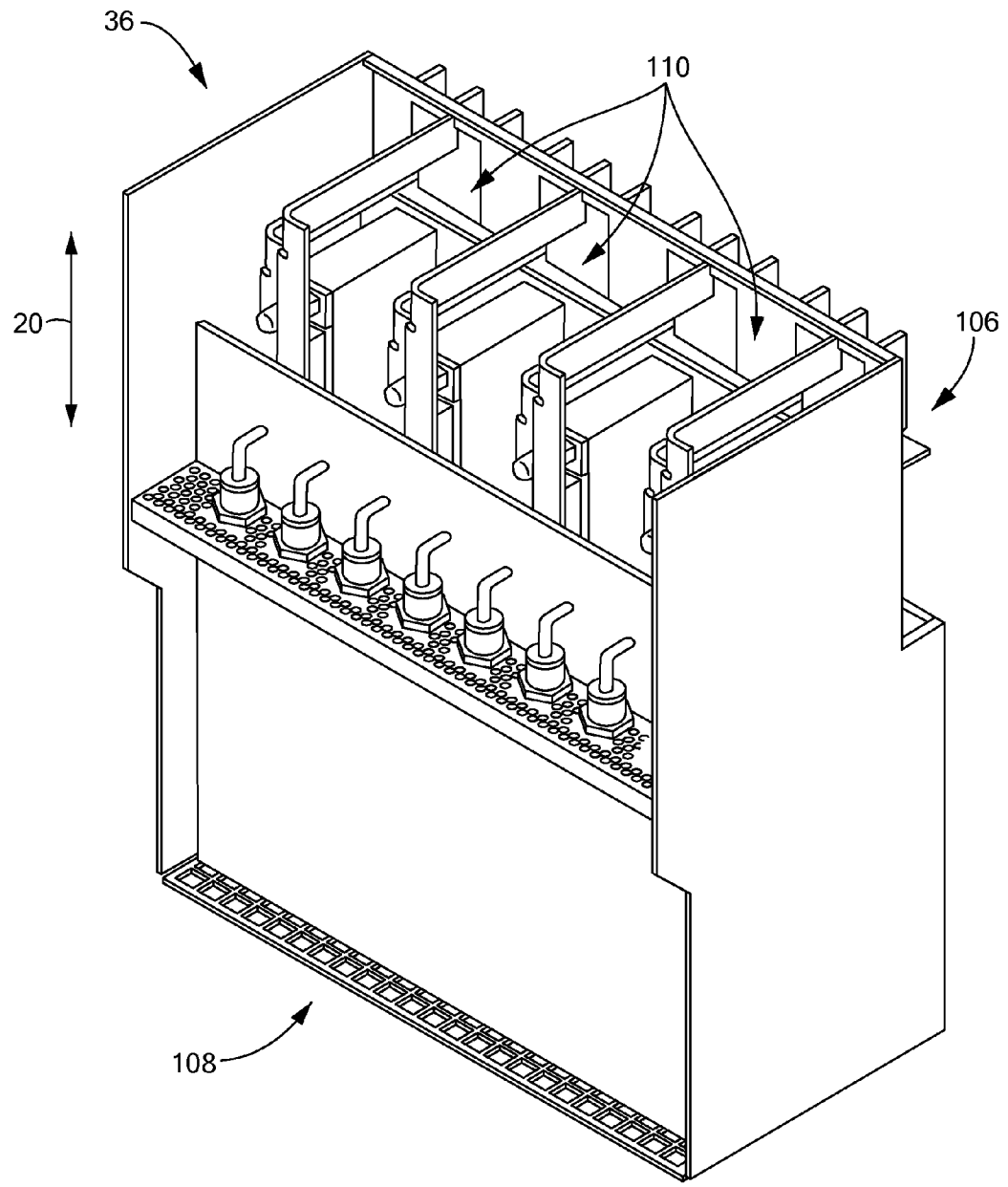
FIG. 9 is a perspective view of a power module of FIG. 2.

FIG. 9 shows an exemplary one of the first power modules 36. The power module 36 has a first side 106, visible in FIG. 2, and a second side 108 positioned within the shared ventilation chamber 72. The components 110 of the first power module 36 are aligned parallel with the first direction 20. As a result, air traveling from the first ventilation chamber 24 to the shared ventilation chamber 72 more easily passes over the components 110 and more efficiently absorbs heat emanating from the power modules 36.

Figure 10:
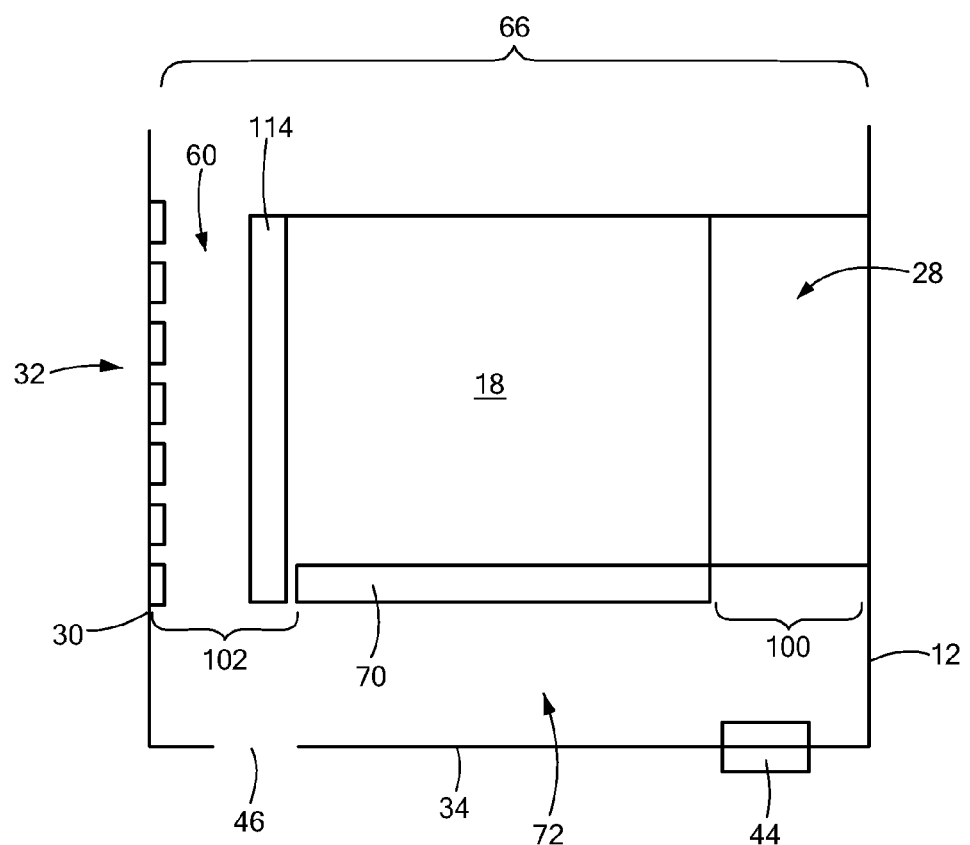
FIG. 10 is another cross sectional view of the high density platform of FIG. 3 taken through section B-B.

FIG. 10 shows a cross-section of the platform 10 at section B-B in FIG. 3. The central set of switch fabric cards 18 is positioned in the middle of the platform 10 and arranged orthogonally to the first set of interface cards 14 and the second set of interface cards 16. The central ventilation chamber 28 is positioned on one side of the central set of switch fabric cards 18 and an air filter 114 may be positioned on the opposite side of the central set of switch fabric cards 18 and between the central set of switch fabric cards 18 and the central air inlet 60. The central cooling unit 44 may create a pressure differential in shared ventilation chamber 72. Ventilation notch 100 places the shared ventilation chamber 72 in fluid communication with central ventilation chamber 28. The pressure differential pulls air through the central set of switch fabric cards 18 and into the central ventilation chamber 28.

The side air access 32 in the third side 30 of the housing 12 may allow air to enter the central air inlet 60. Air then travels from the central air inlet 60, through the air filter 114 and into central set of switch fabric cards 18. The pressure differential created by fans 44 continues to pull this ambient air through the central set of switch fabric cards 18, into the central ventilation chamber 28, through the ventilation notch 100 and into the shared ventilation chamber 72. The access panel 46 on the second side 34 of the housing 12 may provide access to the air filter 114 through the access notch 102 so that it may be removed and replaced or cleaned.

Figure 11:
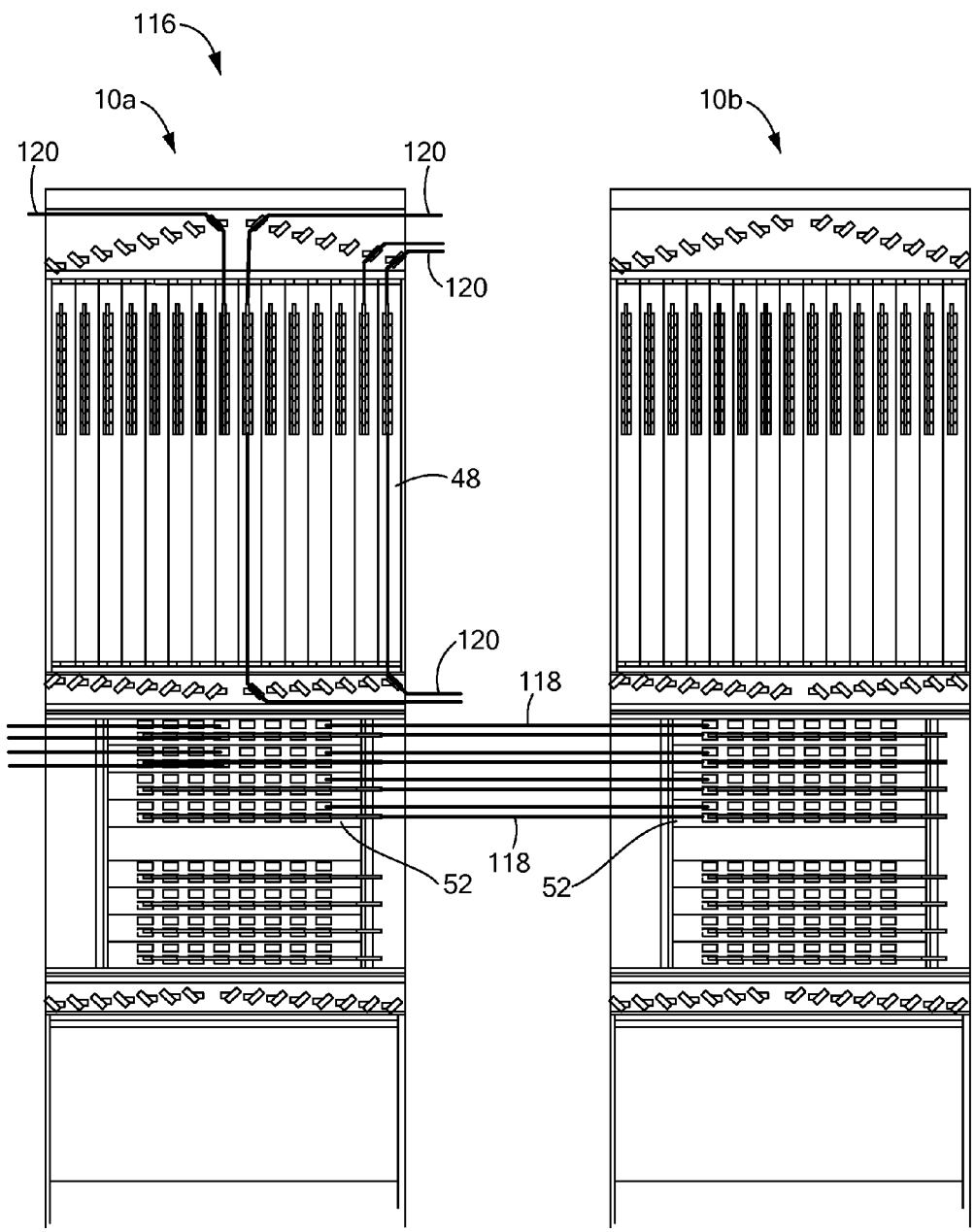
FIG. 11 is a front view showing cable dressing the interconnection of multiple platforms of the present invention.

FIG. 11 is a diagram showing an expanded system of the present invention. As shown, expanded system 116 includes two platforms 10 (shown as platforms 10a and 10b) positioned side-by-side. In accordance with this arrangement, the switching fabric is extended by interconnecting switching fabric cards 52 from platform 10a with those in platform 10b using fiber optic cables 118. This can be accomplished by using cables interconnected to the faceplates of the switching fabric cards 52. Using this arrangement, system expansion can be accomplished such that the fiber optic cables, which may have a three to five inch (7.6 cm to 12.7 cm) bend radius, As is also shown, FIG. 11, fiber optic cable 120 leaving optical ports or interface cards 48 and 50 (not shown) are looped by bend radius limiters with the change in direction to horizontal to exit platform 10. Although FIG. 11 shows two platforms 10, it is understood that more than two platforms 10 can be interconnected.

In addition, unless mention was made above to the contrary, it should be noted that all of the accompanying drawings are not to scale. Significantly, this invention can be embodied in other specific forms without departing from the spirit or essential attributes thereof, and accordingly, reference should be had to the following claims, rather than to the foregoing specification, as indicating the scope of the invention.

What is claimed is:

1. An apparatus, comprising:
a housing having a first side, a second side opposite the first side, and a third side between the first side and the second side;
a backplane having a first side and a second side opposite the first side, the backplane positioned within the housing such that the first side of the backplane faces the first side of the housing;
a first set of circuit cards removably connected to the first side of the backplane and arranged in a first direction;
a second set of circuit cards removably connected to the first side of the backplane and arranged in the first direction;
a central set of circuit cards removably connected to the first side of the backplane between the first set of circuit cards and the second set of circuit cards and arranged orthogonally to the first direction;
a shared ventilation chamber adjacent to the second side of the backplane
a first air inlet between the first set of circuit cards and the central set of circuit cards, the first air inlet being below the first set of cards;
a first ventilation chamber fluidly connected between the first set of circuit cards and the shared ventilation chamber, the first ventilation chamber being above the first set of cards;
a second air inlet between the second set of circuit cards and the central set of circuit cards, the second air inlet being above the second set of cards;
a second ventilation chamber fluidly connected between the second set of circuit cards and the shared ventilation chamber, the second ventilation chamber being below the second set of cards;
a central air inlet between the central set of circuit cards and the third side of the housing, the central air inlet being on a first lateral side of the central set of circuit cards; and
a central ventilation chamber fluidly connected between the central set of circuit cards and the shared ventilation chamber, the central ventilation chamber being on a second lateral side of the central set of circuit cards, the second lateral side being opposite the first lateral side of the central set of circuit cards.

2. The apparatus of claim 1, wherein the backplane includes a ventilation notch providing fluid communication between the central ventilation chamber and the shared ventilation chamber.

3. The apparatus of claim 1, further comprising: a first cooling unit in fluid communication with the first ventilation chamber; a second cooling unit in fluid communication with the second ventilation chamber; and a central cooling unit in fluid communication with the shared ventilation chamber.

4. The apparatus of claim 3, further comprising a plurality of first fiber bend radius limiters arranged diagonally upward toward a center of the housing across the first side of the housing and a plurality of second fiber bend radius limiters arranged diagonally downward toward a center of the housing across the first side of the housing.

5. The apparatus of claim 3, wherein the first cooling unit, the second cooling unit and the third cooling unit each vent air out of the second side of the housing.

6. The apparatus of claim 1, further comprising at least one first power module positioned within the shared ventilation chamber and at least one second power module positioned within the shared ventilation chamber.

7. The apparatus of claim 1, further comprising a side air access on the third side of the housing adjacent to the central air inlet.

8. The apparatus of claim 1, wherein the first set of circuit cards and the second set of circuit cards each extend a first distance from the backplane and the central set of circuit cards extend a second distance from the backplane, wherein the first distance is greater than the second distance.

9. The apparatus of claim 1, further comprising an air filter positioned between the central set of circuit cards and the central air inlet.

10. The apparatus of claim 1, further comprising a first Faraday Cage surrounding the first set of circuit cards, a second Faraday Cage surrounding the second set of circuit cards, and a third Faraday Cage surrounding the central set of circuit cards.

11. The apparatus of claim 1, wherein the first set of circuit cards comprises a first plurality of interface cards, the second set of circuit cards comprises a second plurality of interface cards and the central set of circuit cards comprises a plurality of switch fabric cards.

12. An apparatus, comprising:
- a housing having a first side, a second side opposite the first side and a third side adjacent to the second side and the first side;
- a backplane positioned within the housing and having a first side facing the first side of the housing, a second side facing the second side of the housing and a ventilation notch;
- a first set of interface cards arranged in a first direction and removably positioned between the first side of the backplane and the first side of the housing;
- a first ventilation chamber adjacent to and in fluid communication with the first set of interface cards;
- a second set of interface cards arranged in the first direction and removably positioned between the first side of the backplane and the first side of the housing;
- a second ventilation chamber adjacent to and in fluid communication with the second set of interface cards;
- a central set of switch fabric cards is orthogonal to the first direction and removably positioned between the first set of interface cards and the second set of interface cards;
- a central ventilation chamber adjacent to and in fluid communication with the central set of circuit cards and positioned between the first set of interface cards and the second set of interface cards; and
- a shared ventilation chamber positioned between the second side of the backplane and the second side of the housing;
- the ventilation notch of the backplane providing fluid communication between the shared ventilation chamber and the central ventilation chamber.

13. The apparatus of claim 12, further comprising at least one first power module disposed on the second side of the housing in the shared ventilation chamber and at least one second power module disposed on the second side of the housing in the shared ventilation chamber;
- wherein the one or more first power modules are cooled by air flow from the first ventilation chamber to the shared ventilation chamber; and
- wherein the one or more second power modules are cooled by air flow from the second ventilation chamber to the shared ventilation chamber.

14. The apparatus of claim 12, wherein the first set of interface cards and the second set of interface cards each extend a first distance from the backplane and the central set of circuit cards extend a second distance from the backplane, the first distance being greater than the second distance.

* * * * *